US010578435B2

(12) United States Patent
Lin et al.

(10) Patent No.: US 10,578,435 B2
(45) Date of Patent: Mar. 3, 2020

(54) QUALITY FACTOR COMPENSATION IN MICROELECTROMECHANICAL SYSTEM (MEMS) GYROSCOPES

(71) Applicant: Analog Devices, Inc., Norwood, MA (US)

(72) Inventors: James Lin, Reading, MA (US); Ronald A. Kapusta, Jr., Carlisle, MA (US); Lijun Gao, Shoreview, MN (US)

(73) Assignee: Analog Devices, Inc., Norwood, MA (US)

( * ) Notice: Subject to any disclaimer, the term of this patent is extended or adjusted under 35 U.S.C. 154(b) by 217 days.

(21) Appl. No.: 15/869,163

(22) Filed: Jan. 12, 2018

(65) Prior Publication Data

US 2019/0219394 A1  Jul. 18, 2019

(51) Int. Cl.
*G01C 19/56* (2012.01)
*B81B 3/00* (2006.01)

(52) U.S. Cl.
CPC .......... *G01C 19/56* (2013.01); *B81B 3/0018* (2013.01); *B81B 2201/0242* (2013.01)

(58) Field of Classification Search
CPC .............................. G01C 19/56; B81B 3/0018
USPC ...................................................... 73/514.38
See application file for complete search history.

(56) References Cited

U.S. PATENT DOCUMENTS

| | | |
|---|---|---|
| 5,218,867 A | 6/1993 | Varnham et al. |
| 5,540,094 A | 7/1996 | Varnham et al. |
| 5,866,816 A | 2/1999 | Hulsing, II |
| 5,889,193 A | 3/1999 | Pfaff et al. |
| 5,969,225 A | 10/1999 | Kobayashi |
| 5,987,984 A | 11/1999 | Artzner |
| 5,992,233 A | 11/1999 | Clark |
| 6,018,996 A | 2/2000 | Matsuhiro et al. |

(Continued)

FOREIGN PATENT DOCUMENTS

| | | |
|---|---|---|
| CN | 102620726 | 8/2012 |
| CN | 107449414 A | 12/2017 |

(Continued)

OTHER PUBLICATIONS

Aaltonen et al., An analog drive loop for a capacitive MEMS gyroscope. Analog Integr Circ Sig Process. 2010;63:465-76.

(Continued)

*Primary Examiner* — Jamel E Williams
(74) *Attorney, Agent, or Firm* — Wolf, Greenfield & Sacks, P.C.

(57) ABSTRACT

Circuits and methods for compensating microelectromechanical system (MEMS) gyroscopes for quality factor variations are described. Quality factor variations arise when mechanical losses are introduced in the gyroscope's resonator, for example due to thermoelastic damping or squeeze-film damping, which may hinder the gyroscope's ability to accurately sense angular velocity. Quality factor compensation may be performed by generating a compensation signal having a time decay rate that depends on the quality factor of resonator. In this way, artifacts that may otherwise arise in gyroscope's output are limited. Additionally, or alternatively, quality factor compensation may be performed by controlling the force with which the gyroscope's resonator is driven. This may be achieved, for example, by controlling the average value of the drive signal.

20 Claims, 8 Drawing Sheets

(56) References Cited

U.S. PATENT DOCUMENTS

| | | |
|---|---|---|
| 6,198,355 B1 | 3/2001 | Lindquist et al. |
| 6,510,737 B1 | 1/2003 | Hobbs |
| 6,598,455 B1 | 7/2003 | Gutierrez |
| 6,768,358 B2 | 7/2004 | Birk et al. |
| 6,934,665 B2 | 8/2005 | Rober |
| 7,123,111 B2 | 10/2006 | Brunson et al. |
| 7,188,522 B2 | 3/2007 | Betz |
| 7,219,529 B2 | 5/2007 | Fell |
| 7,253,615 B2 | 8/2007 | Berkcan et al. |
| 7,640,803 B1 | 1/2010 | Gutierrez |
| 7,980,133 B2 | 7/2011 | Geen et al. |
| 8,151,641 B2 | 4/2012 | Geen |
| 8,347,718 B2 | 1/2013 | Malvern |
| 8,375,789 B2 | 2/2013 | Prandi et al. |
| 8,401,140 B2 | 3/2013 | Mijuskovic |
| 8,446,222 B2 | 5/2013 | Brenndorfer |
| 8,464,571 B1 | 6/2013 | Sparks et al. |
| 8,497,746 B2 | 7/2013 | Visconti et al. |
| 8,616,055 B2 | 12/2013 | Geen |
| 8,624,679 B2 | 1/2014 | Dikshit et al. |
| 8,661,898 B2 | 3/2014 | Watson |
| 8,689,631 B1 | 4/2014 | Tally et al. |
| 8,701,459 B2 | 4/2014 | Geen |
| 8,884,710 B2 | 11/2014 | Shaeffer et al. |
| 9,103,845 B2 | 8/2015 | Schlarmann et al. |
| 9,176,165 B2 | 11/2015 | Quer et al. |
| 9,278,847 B2 | 3/2016 | Cazzaniga et al. |
| 9,410,806 B2 | 8/2016 | Ezekwe |
| 9,459,100 B2 | 10/2016 | Balachandran et al. |
| 9,506,757 B2 | 11/2016 | Shaeffer et al. |
| 9,634,678 B1 | 4/2017 | Caffee et al. |
| 9,709,400 B2 | 7/2017 | Kapusta |
| 2001/0029784 A1 | 10/2001 | Kurachi et al. |
| 2003/0101814 A1 | 6/2003 | Challoner |
| 2005/0183502 A1 | 8/2005 | Rodney |
| 2005/0257596 A1 | 11/2005 | Fell |
| 2006/0142958 A1 | 6/2006 | Morell et al. |
| 2006/0201250 A1 | 9/2006 | Kourepenis |
| 2007/0119258 A1 | 5/2007 | Yee |
| 2007/0163345 A1 | 7/2007 | Nozoe |
| 2007/0256495 A1 | 11/2007 | Watson |
| 2008/0170742 A1 | 7/2008 | Trusov et al. |
| 2009/0083011 A1 | 3/2009 | Hao |
| 2009/0249875 A1 | 10/2009 | Steinlechner |
| 2009/0272189 A1 | 11/2009 | Acar et al. |
| 2009/0282916 A1 | 11/2009 | Modugno |
| 2010/0212424 A1 | 8/2010 | Malvern |
| 2010/0271067 A1 | 10/2010 | Cauli et al. |
| 2011/0167891 A1 | 7/2011 | Geen |
| 2012/0006114 A1 | 1/2012 | Caminada et al. |
| 2012/0024057 A1 | 2/2012 | Sasaki et al. |
| 2013/0098153 A1 | 4/2013 | Trusov |
| 2013/0283908 A1* | 10/2013 | Geen .................. G01C 19/5719 73/504.12 |
| 2014/0000365 A1 | 1/2014 | Aaltonen et al. |
| 2014/0000366 A1 | 1/2014 | Blomquist |
| 2014/0085017 A1 | 3/2014 | Tsinker |
| 2015/0226557 A1 | 8/2015 | Aaltonen |
| 2015/0247877 A1 | 9/2015 | Kanemoto |
| 2015/0285658 A1 | 10/2015 | Zotov |
| 2015/0341041 A1 | 11/2015 | Balachandran et al. |
| 2016/0298963 A1 | 10/2016 | Kapusta et al. |
| 2016/0298965 A1 | 10/2016 | Kapusta |
| 2016/0334213 A1* | 11/2016 | DeWall .............. G01C 19/5712 |
| 2017/0135600 A1 | 5/2017 | Chien et al. |
| 2017/0214407 A1 | 7/2017 | Kianush et al. |
| 2017/0307374 A1* | 10/2017 | Hughes .............. G01C 19/5712 |

FOREIGN PATENT DOCUMENTS

| | | |
|---|---|---|
| EP | 2211458 A1 | 7/2010 |
| EP | 2 657 648 A2 | 10/2013 |
| JP | 2013-521486 | 6/2013 |
| WO | WO 01/79862 A1 | 10/2001 |

OTHER PUBLICATIONS

Balachandran et al., A 3-Axis Gyroscope for Electronic Stability Control With Continuous Self-Test. IEEE Journal of Solid-State Circuits. Jan. 2016;51(1):177-186.

Izyumin, Readout Circuits for Frequency-Modulated Gyroscopes. Electrical Engineering and Computer Sciences. University of California at Berkely. Technical Report No. UCB/EECS-2015-214. Dec. 1, 2015; 93 pages.

Kundert, Predicting the Phase Noise and Jitter of PLL-Based Frequency Synthesizers. The Designer's Guide Community. Oct. 2015; Version 4i:pp. 1-52.

International Search Report and Written Opinion Application dated Jul. 28, 2016 in connection with International Application No. PCT/US2016/026385.

International Preliminary Report on Patentability dated Oct. 19, 2017 in connection with International Application No. PCT/US2016/026385.

Great Britain Combined Search and Examination Report dated Oct. 12, 2016 in connection with Great Britain Application No. GB1604932.2.

[No Author Listed], ADXC1500, Combined gyroscope and dual-axis accelerometer. Analog Devices Data Sheet. Retrieved from the Internet (last accessed Apr. 20, 2018) http://www.analog.com/en/products/sensors-mems/inertial-measurement-units/adxc1500.html.

[No Author Listed], ADXRS290 Ultralow noise, dual-axis MEMS gyroscope for stabilization applications. Analog Devices Data Sheet. Retrieved from the Internet (last accessed Apr. 20, 2018) http://www.analog.com/en/products/sensors-mems/gyroscopes/adxrs290.html#product-overview.

Ayazi et al., A HARPSS Polysilicon Vibrating Ring Gyroscope. Journal of Microelectromechanical Systems. Jun. 2001;10(2):169-179.

Ayazi et al., Design and Fabrication of a High-Performance Polysilicon Vibrating Ring Gyroscope. Center for Integrated Sensors and Circuits. Eleventh IEEE/ASME International Workshop on Micro Electro Mechanical Systems. Germany, Jan. 1998;pp. 621-626.

Ayazi et al., High Aspect-Ratio Combined Poly and Single-Crystal Silicon (HARPSS) MEMS Technology. Journal of Microelectromechanical Systems. Sep. 2000;9(3):288-294.

Fan et al., An adaptive feedback circuit for MEMS resonators. Journal of Micromechanics and Microengineering. 2011;21:045008.

Geen et al., New iMEM® Angular-Rate-Sensing Gyroscope. ADI Micromachined Products Division. Analog Dialogue. 2003; p. 37-3.

Leland, Adaptive Mode Tuning for Vibrational Gyroscopes. IEEE Transactions on Control Systems Technology. Mar. 2003;11(2):242-7.

Mathias et al., Architecture for Integrated MEMS Resonators Quality Factor Measurement. DTIP of MEMS & MOEMS Conf. Stresa, Italy. Apr. 25-27, 2007; 5 pages.

Nguyen, Micromechanical Resonators for Oscillators and Filters. IEEE Ultrasonics Symposium. Nov. 1995;1:489-99.

Oboe et al., Control of a Z-Axis MEMS Vibrational Gyroscope. IEEE/ASME Transactions on Mechatronics. Aug. 2005;10(4):364-370.

Ozdemir et al., Measuring the Quality Factor in MEMS Devices. Micromachines. 2015;6:1935-45.

Park et al., Laterally Oscillated and Force-Balanced Micro Vibratory Rate Gyroscope Supported by Fish Hook Shape Springs. Proceedings of the IEEE 10th Annual International Workshop on Micro Electro Mechanical Systems. Jan. 1997;pp. 494-499.

(56) References Cited

OTHER PUBLICATIONS

Tang et al., A Packaged Silicon MEMS Vibratory Gyroscope for Microspacecraft. Proceedings of the IEEE 10th Annual International Workshop on Micro Electro Mechanical Systems. Jan. 1997; pp. 500-505.

Zeng et al., An energy-efficient readout circuit for resonant sensors based on ring-down measurement. Review of Scientific Instruments. 2013;84:025005.

Zhang et al., High precision measurement of quality factor for MEMS resonators. Science Direct, Procedia Chemistry. 2009;1:827-830.

* cited by examiner

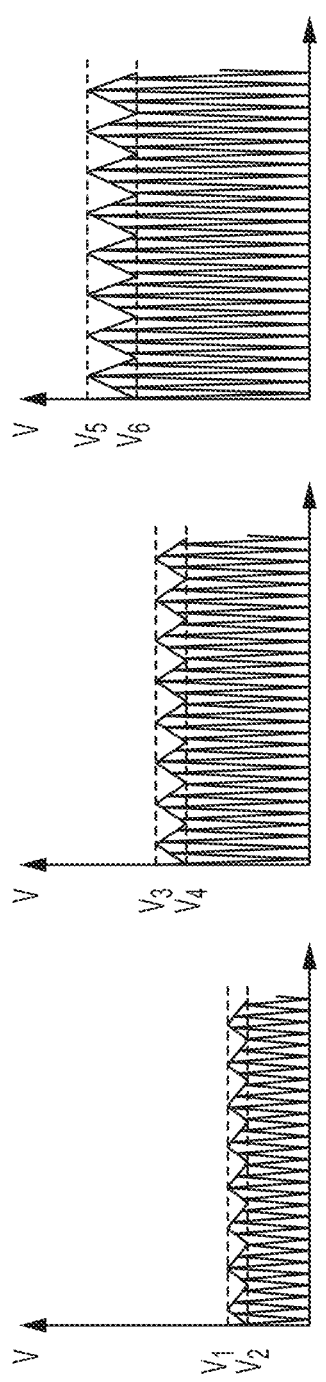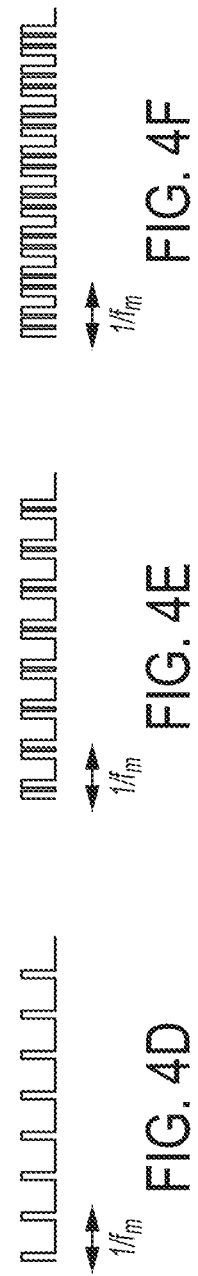

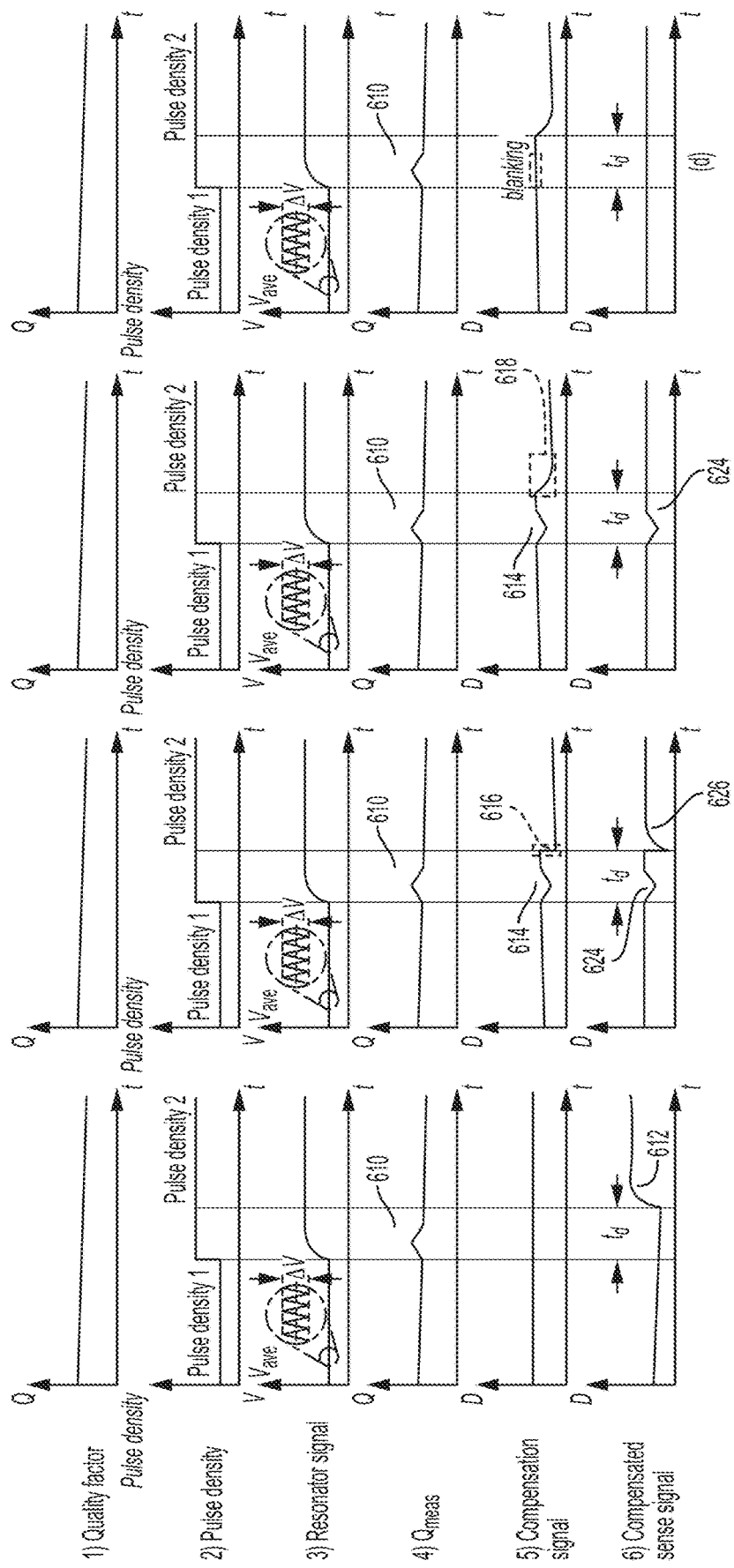

QUALITY FACTOR COMPENSATION IN MICROELECTROMECHANICAL SYSTEM (MEMS) GYROSCOPES

FIELD OF THE DISCLOSURE

The present disclosure relates to microelectromechanical system (MEMS) gyroscopes.

BACKGROUND

Microelectromechanical systems (MEMS) gyroscopes are configured to detect angular motion by sensing accelerations produced by Coriolis forces. Coriolis forces arise when a resonant mass of a MEMS gyroscope is subjected to angular motion.

SUMMARY OF THE DISCLOSURE

Some aspects of the present disclosure are directed to circuits and methods for compensating microelectromechanical system gyroscopes for quality factor variations. Variations of the Quality factor occur when mechanical losses are introduced in the gyroscope's resonator, for example due to thermo-elastic damping or squeeze-film damping, which may hinder the gyroscope's ability to accurately sense angular velocity. Quality factor compensation may be performed by generating a compensation signal having a time decay rate that depends on the quality factor of the gyroscope's resonator. In this way, artifacts that may otherwise arise in gyroscope's output are limited. Additionally or alternatively, quality factor compensation may be performed by controlling the force with which the gyroscope's resonator is driven. This may be achieved by controlling the average value of the drive signal in some embodiments.

According to one aspect of the present disclosure, a method is described. The method may comprise receiving, from a resonator of a MEMS gyroscope, a resonator signal generated in response to motion of the resonator; determining a quality factor of the resonator using the resonator signal; generating a compensation signal having at least one time characteristic determined using the quality factor of the resonator; receiving, from a sensor of the MEMS gyroscope, a sense signal generated in response to angular motion of the MEMS gyroscope; and generating a compensated sense signal using the sense signal and the compensation signal.

According to another aspect of the present disclosure, a MEMS apparatus is described. The MEMS apparatus may comprise a gyroscope comprising a sensor and a resonator; and control circuitry configured to: receive, from the resonator, a resonator signal generated in response to motion of the resonator; determine a quality factor of the resonator using the resonator signal; generate a compensation signal having a time characteristic determined using the quality factor of the resonator; receive, from the sensor, a sense signal generated in response to angular motion of the MEMS gyroscope; and generate a compensated sense signal using the sense signal and the compensation signal.

According to another aspect of the present disclosure, a microelectromechanical systems (MEMS) apparatus is described. The MEMS apparatus may comprise a gyroscope comprising a sensor and a resonator; a quality factor measuring circuit coupled to a motion detection electrode of the resonator; a compensation circuit having an input terminal coupled to the quality factor measuring circuit and an output terminal, the compensation circuit comprising transient compensation circuitry; and signal combination circuitry coupled to the sensor and the output terminal of the transient compensation circuitry.

BRIEF DESCRIPTION OF THE DRAWINGS

Various aspects and embodiments of the disclosure are described with reference to the following figures. The figures are not necessarily drawn to scale. Items appearing in multiple figures are indicated by the same reference number in all the figures in which they appear.

FIGS. 4A-4C show illustrative examples of resonator signals having different amplitudes, in accordance with some embodiments of the technology described herein.

FIGS. 4D-4F show illustrative examples of drive signals having different pulse densities, in accordance with some embodiments of the technology described herein.

FIG. 6A is a plot illustrating the operation of a circuit including an open-loop resonator path compensation, in accordance with some embodiments of the technology described herein.

FIG. 6B is a plot illustrating the operations of the compensation circuit of FIG. 5A, in accordance with some embodiments of the technology described herein.

FIG. 6C is a plot illustrating the operations of the compensation circuit of FIG. 5B, in accordance with some embodiments of the technology described herein.

FIG. 6D is a plot illustrating the operations of the compensation circuit of FIG. 5C, in accordance with some embodiments of the technology described herein.

DETAILED DESCRIPTION

I. Overview

Figure 1A:
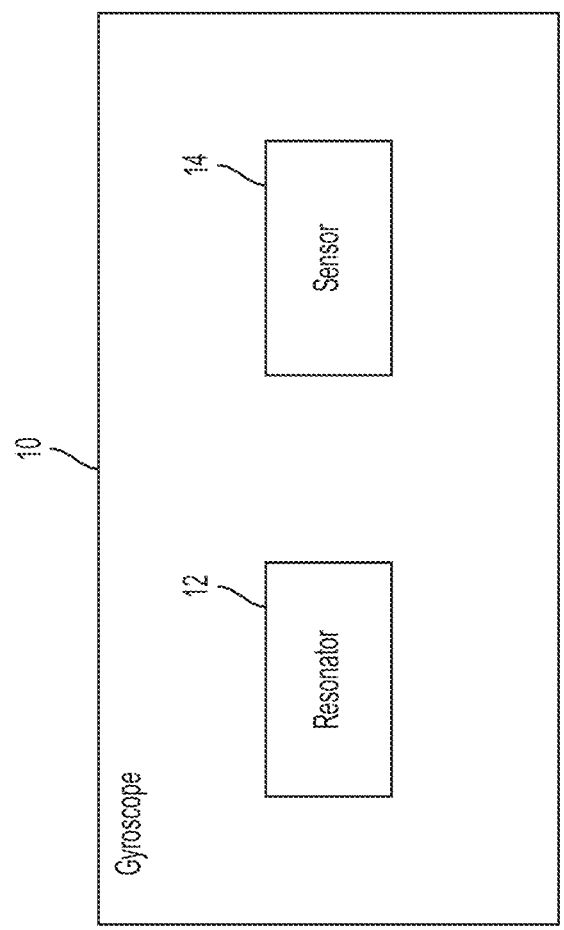
FIG. 1A is a block diagram illustrating a microelectromechanical system gyroscope, in accordance with some embodiments of the technology described herein.

The inventors have recognized and appreciated that the ability of gyroscopes to accurately detect the velocity of angular motion to which they are subjected may be impaired by unwanted variations in the quality factor of the gyroscope's resonator. Quality factor is referred to herein as the ratio between the resonant frequency and the bandwidth of a gyroscope's resonator.

In some circumstances, variations in the quality factor relative to the nominal value may occur in response to mechanical losses arising in the resonator, which may be due to, among other phenomena, thermo-elastic damping or squeeze-film damping. Such mechanical losses may result in a broadening or narrowing of the resonator's spectral response, thus leading to a change in the quality factor. When a variation in the quality factor occurs, the amplitude response of the gyroscope may vary over time, even if the magnitude of the angular velocity remains unchanged. Such a variation gives rise to undesirable distortions in the gyroscope's output signal.

The inventors have further recognized and appreciated that a conventional gyroscope, which may be susceptible to variations in the quality factor, may be improved by compensating the output signal of the gyroscope for the quality factor variations. In some embodiments, the compensating may be performed by: (1) determining the quality factor of a gyroscope based on the gyroscope resonator signal; (2) generating a compensation signal using the determined quality factor; and (3) multiplying the gyroscope's sense signal by the compensation signal. In some embodiments, the compensating may be performed in real time (e.g., as angular motion is being detected). In some embodiments, a control circuitry is coupled to the gyroscope and is configured to determine variations in the quality factor of the resonator, and to generate a compensation signal as these variations occur. In this way, changes of quality factor are continuously monitored and discounted from the gyroscope's output.

In some embodiments, an open-loop resonator signal path compensation may be applied to the gyroscope. The open-loop resonator signal path compensation, which may be viewed as a coarse compensation technique in some embodiments, may be used for limiting major changes in the gyroscope's output resulting from variations in the quality factor. In some embodiments, the open-loop resonator signal path compensation is performed by adjusting the force with which the gyroscope's resonator is driven. The extent to which the force is varied may depend on the extent to which the quality factor has changed. For example, the larger the extent to which the Quality factor has diminished, the larger the force that may be applied to the resonator.

The inventors have further recognized and appreciated, however, that the impact of quality factor variations on a gyroscope's sensitivity may be further reduced by using an sense signal path compensation in addition to the open-loop resonator signal path compensation. Accordingly, in some embodiments, the open-loop resonator signal path compensation may introduce distortions in the output of the gyroscope which may lead to unsatisfactory measures of angular velocity. The sense signal path compensation, which may be viewed as a fine compensation technique in some embodiments, may be aimed at limiting the formation of these distortions. For example, in some embodiments, a compensation signal may be generated having a time characteristic determined based on the quality factor of the resonator. One example of a time characteristic is time decay rate. Accordingly, in one specific example, a compensation signal is generated having a time decay rate determined based on the quality factor. Since the time decay rate is tied to the quality factor, distortions in the gyroscope's output that may arise due to the open-loop resonator signal path compensation may be limited or even completely suppressed. In addition, in some embodiments, to further limit distortions in the gyroscope's output, the compensation signal may be forced to a substantially constant value, during a certain time period. This technique, refer to herein as "blanking", may limit peaks or other features that may otherwise distort the gyroscope's output.

It should be appreciated that, in some circumstances, the sense signal path compensation may be used without having to use the open-loop resonator signal path compensation. This may be the case, for example, when it is anticipated that the quality factor variation are small.

It should be appreciated that the techniques introduced above and discussed in greater detail below may be implemented in any of numerous ways, as the techniques are not limited to any particular manner of implementation. Examples of details of implementation are provided herein solely for illustrative purposes. Furthermore, the techniques disclosed herein may be used individually or in any suitable combination, as aspects of the technology described herein are not limited to the use of any particular technique or combination of techniques.

FIG. 1A is a block diagram illustrating a gyroscope 10, in accordance with some embodiments. Gyroscope 10 comprises resonator 12 and sensor 14. Resonator 12 is configured to oscillate when driven by a drive signal having a frequency $f_R$. Sensor 14 (which may be an accelerometer in some embodiments) is configured to sense angular velocities. Accordingly, when gyroscope 10 is subjected to angular motion (e.g., when the gyroscope is rotated relative to an axis), the angular rate at which the angular motion occurs (e.g., the rate of rotation about the axis) can be sensed using sensor 14.

In some embodiments, gyroscope 10 is configured to sense angular velocities by detecting acceleration arising from the Coriolis effect. The Coriolis effect, and hence a Coriolis force, arises when: 1) resonator 12 oscillates; and 2) the gyroscope is subjected to angular motion. In these circumstances, sensor 14 may detect the acceleration resulting from the Coriolis effect. The angular rate associated with the angular motion may be inferred from the acceleration, for example, by using sense circuitry coupled to sensor 14.

Resonator 12 and sensor 14 may be arranged in any suitable way. In some embodiments, resonator 12 may include a proof mass and sensor 14 may include a separate proof mass. In other embodiments, resonator 12 and sensor 14 may share the same proof mass.

Figure 1B:
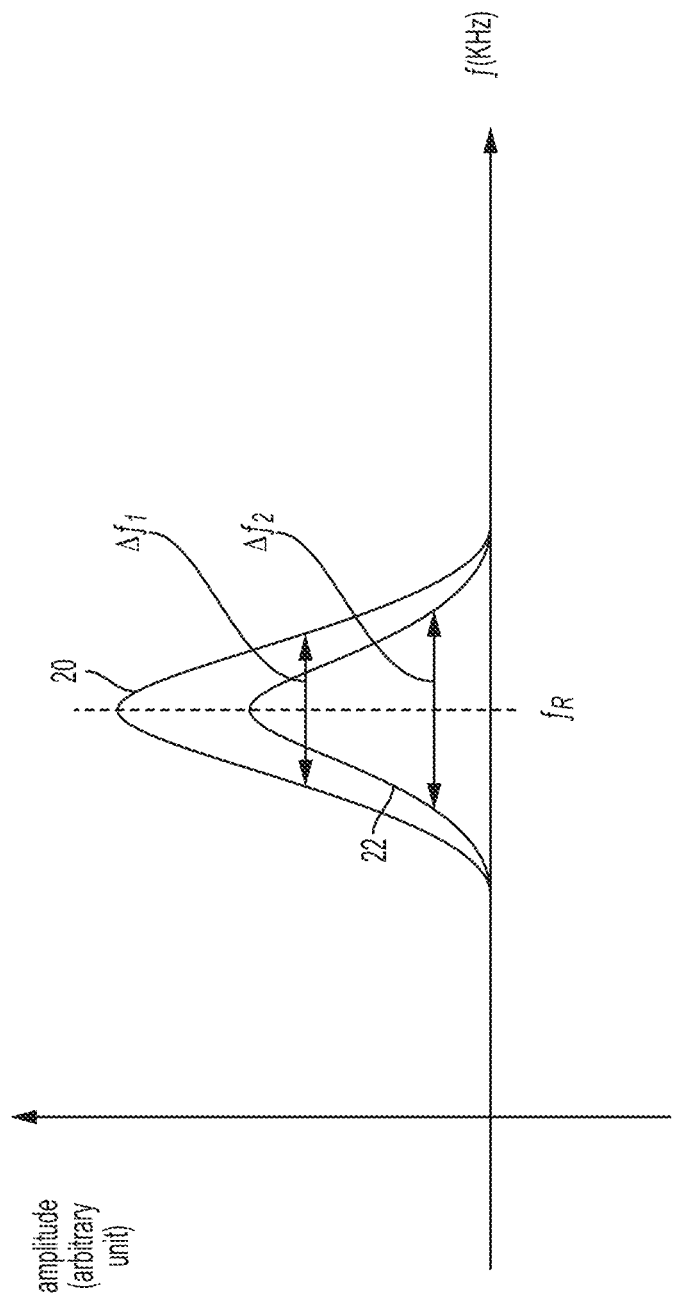
FIG. 1B is a plot illustrating the spectral response of the resonator of FIG. 1A at different times, in accordance with some embodiments of the technology described herein.

In some embodiments, the gyroscope's ability to accurately sense angular motion may be impaired by the fact that resonator 12's quality factor varies over time, which may be due to losses in the mechanical system. Different factors may lead to losses, including mechanical damping, thermo-elastic damping, squeeze-film damping. The losses may depend on the environment's temperature and/or pressure. FIG. 1B is a plot illustrating the spectral response of resonator 12 at time $t_1$ and $t_2$ ($t_2$ being subsequent to $t_1$), in accordance with some embodiments. In particular, curve 20 represents the spectral response of resonator 12 at time $t_1$ and curve 22 represents the spectral response of resonator 12 at time $t_2$, where both curves are plotted as amplitude vs. frequency. As illustrated, both curves have maxima at frequency $f_R$, the resonant frequency of resonator 12. However, curve 20 exhibits a bandwidth $\Delta f_1$ while curve 22 exhibits a bandwidth $\Delta f_2$ greater than $\Delta f_1$ (where bandwidths $\Delta f_1$ and $\Delta f_2$ may represent the respective 3 dB-bandwidths). The broadening of the bandwidth between $t_1$ and $t_2$ can be attributed, for example, to a temperature increase. As a result, the quality factor of the resonator (which is defined as the ratio between $f_R$ and $\Delta f$) is degraded between $t_1$ and $t_2$. Some aspects of the technology described herein are directed to circuits and techniques for compensating MEMS gyroscopes for quality factor variations.

II. Example of a MEMS Gyroscope

Figure 2:
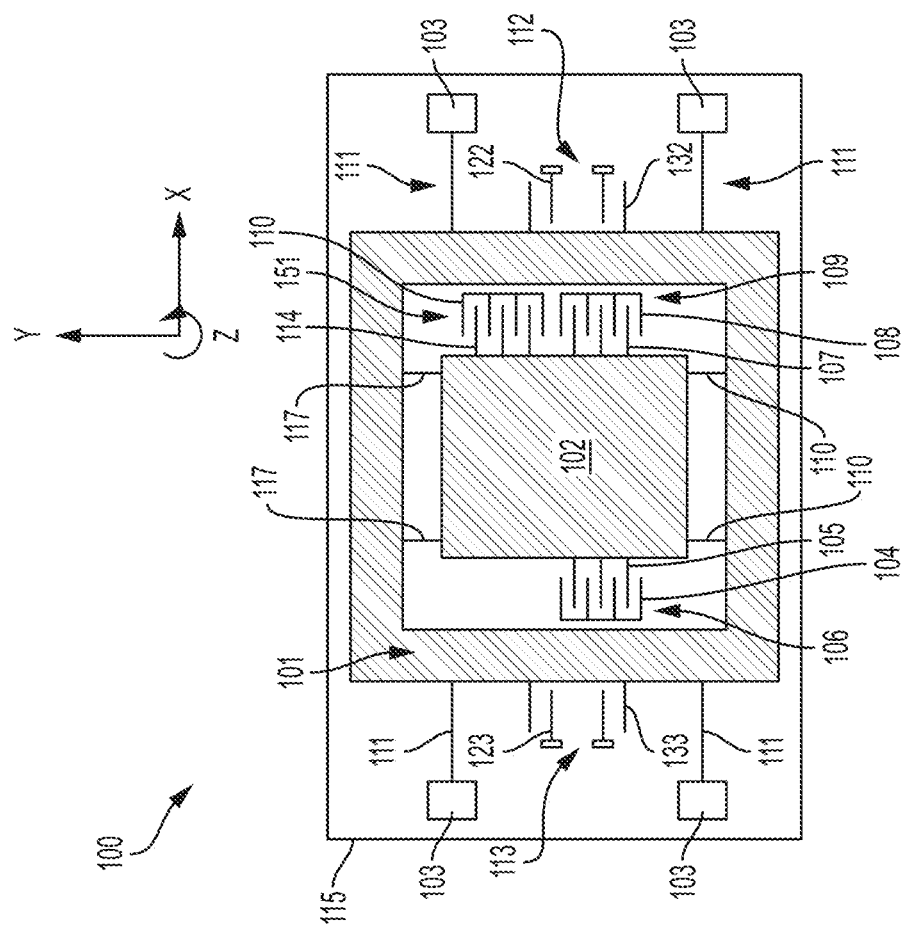
FIG. 2 is a schematic of an illustrative MEMS gyroscope that may serve as the MEMS gyroscope of FIG. 1A, in accordance with some embodiments of the technology described herein.

One example implementation of gyroscope 10 is illustrated in FIG. 2, in accordance with some embodiments. In this example, gyroscope 100 is configured to resonate in a direction parallel to the x-axis and to detect Coriolis forces in a direction parallel to the y-axis. It should be appreciated, however, that gyroscopes of the types described herein are not limited to any specific direction of resonance or detection.

MEMS gyroscope 100 includes proof masses 101 and 102, anchors 103, fingers 105, 107, 114, 132 and 133, and stationary electrodes 104, 108, 110, 122 and 123. Proof masses 101 and 102 may be suspended above substrate 115, which may be made of silicon in some embodiments. Substrate 115, proof masses 101 and 102, anchors 103, fingers 105, 107, 114, 132 and 133, and stationary electrodes 104, 108, 110, 122 and 123 may be fabricated using MEMS techniques. For example, proof masses 101 and 102 may be formed by depositing a layer of material on top of a sacrificial layer. Subsequently, the sacrificial layer may be etched, thus leaving the proof masses suspended above the substrate 115. In one example, proof masses 101 and 102 are made of polysilicon (doped or undoped). Proof masses 102 sand 101 may serve as resonator 12 and sensor 14 (see FIG. 1A), respectively.

Proof mass 101 is connected to the substrate via anchors 103, which may extend in a direction parallel to the z-axis. In addition, proof mass 101 is connected to the anchors via flexures 111. Flexures 111 may allow for motion of proof mass 101 in a direction parallel to the y-axis.

As illustrated, proof mass 102 is enclosed within proof mass 101 in the xy-plane. However, not all embodiments are limited to this arrangement. Proof mass 101 and 102 are elastically coupled to one another via flexures 117. Flexures 117 allow for motion of proof mass 102 in a direction parallel to the x-axis.

Operation of the MEMS gyroscope 100 is based on the Coriolis effect. In the example of FIG. 2, angular motion of the MEMS gyroscope about the z-axis may be detected by detecting acceleration of the proof mass 101 in the y-axis direction when proof mass 102 is driven to oscillate in the x-axis direction. As such, the x-axis is referred to herein as the "resonator axis" and the y-axis is referred to herein as the "Coriolis axis." However, MEMS gyroscopes of the types described herein are not limited to detection of angular motion about the z-axis as shown in the figure, but can be used to detect motion about any suitable axis. Additionally, some MEMS gyroscopes may even be configured as multi-axis gyroscopes, whereby angular motion about two or three axes may be detected using a single device (e.g., a single pair of elastically coupled proof masses).

Oscillation of proof mass in the x-axis direction may be initiated using drivers 106 and 109 (though any other suitable number of drivers may be used). Driver 106 includes stationary electrodes 104 and fingers 105. Stationary electrodes 104 may be attached to substrate 115 via anchors extending along the z-axis. Fingers 105 are connected to, and extend away from, proof mass 102. Fingers 105 and stationary electrodes 104 are arranged in an alternating configuration and form a plurality of capacitors. Similarly, driver 109 includes stationary electrodes 108 and fingers 107. Motion of the proof mass 102 along the x-axis may be instituted through the application of a signal at the capacitors formed between the stationary electrodes and the fingers. Accordingly, when a signal is applied at the capacitors, attractive electrostatic forces arise which cause displacement of the proof mass from its initial position in the x-axis direction. Application of periodic signals (e.g., sinusoidal signals) may cause the proof mass to oscillate periodically. Drivers 106 and 109 may be driven with signals that are out-of-phase (e.g., by approximately 180°) relative to one another.

As will be described in detail further below, in some embodiments, it may be desirable to monitor the motion of proof mass 102 during operation. Monitoring of the motion may be achieved using motion detector 151. Motion detector 151 includes stationary electrodes 110 and fingers 114 forming a plurality of capacitors. For the sake of simplicity, only one motion detector 151 is shown in the exemplary embodiment of FIG. 2, although alternative embodiments may have additional motion detectors. When the proof mass moves in response to a drive signal, the extent to which finger 114 and stationary electrode 110 overlap with another is varied (due to a longitudinal motion of the finger), thus varying the capacitance of the capacitor. As such, a sense signal may be generated in the motion detector 151 in response to motion of proof mass 102. For example, motion of the proof mass may give rise to an electric current in the capacitors of motion detector 151 whose amplitude is proportional to the instantaneous velocity of the proof mass.

When MEMS gyroscope 100 is subjected to angular motion about the z-axis (assuming that proof mass 102 is oscillating when the angular motion occurs), a Coriolis force is generated which may result in an acceleration in the y-axis direction. The velocity at which the angular motion occurs may be inferred from the amplitude of the Coriolis force-induced acceleration. In some embodiments, proof mass 101 may be used to sense these accelerations. Specifically, in the embodiment of FIG. 2, motion detector 112 (which includes stationary electrodes 122 and fingers 132) and motion detector 113 (which includes stationary electrodes 123 and fingers 133) may be used to sense motion of the proof mass 101 in the y-axis direction. Accordingly, motion of the proof mass 101 in the y-axis direction may generate an electric current in the capacitors of the motion detectors 112 and 113. The magnitude of the acceleration experienced by the proof mass 101, and as a result the angular velocity of MEMS gyroscope 100, may be inferred from the electric current generated by the motion detectors 112 and 113.

Control of the operations of MEMS gyroscope 10 is performed using control circuitry, which may be integrated in the same substrate as the gyroscope or in a separate substrate. The control circuitry may include circuits for causing resonator 12 to oscillate, circuits for monitoring motion of resonator 12, circuits for sensing motion of sensor 14, and/or circuits for stabilizing the motion of sensor 14.

III. Quality Factor Compensation

Variations in the resonator's quality factor may diminish the gyroscope's ability to accurately sense angular velocity. In some embodiments, compensation of the gyroscope for quality factor variations may be performed by 1) receiving, using control circuitry, a signal generated in response to motion of the resonator, 2) determining the quality factor of the resonator, based on the received signal, while it oscillates 3) generating a compensation signal having a time characteristic (for example, a time decay rate) determined using the quality factor, 4) receiving a sense signal generated in response to angular motion of the gyroscope, and 5) combining the sense signal with the compensation signal.

Figure 3A:
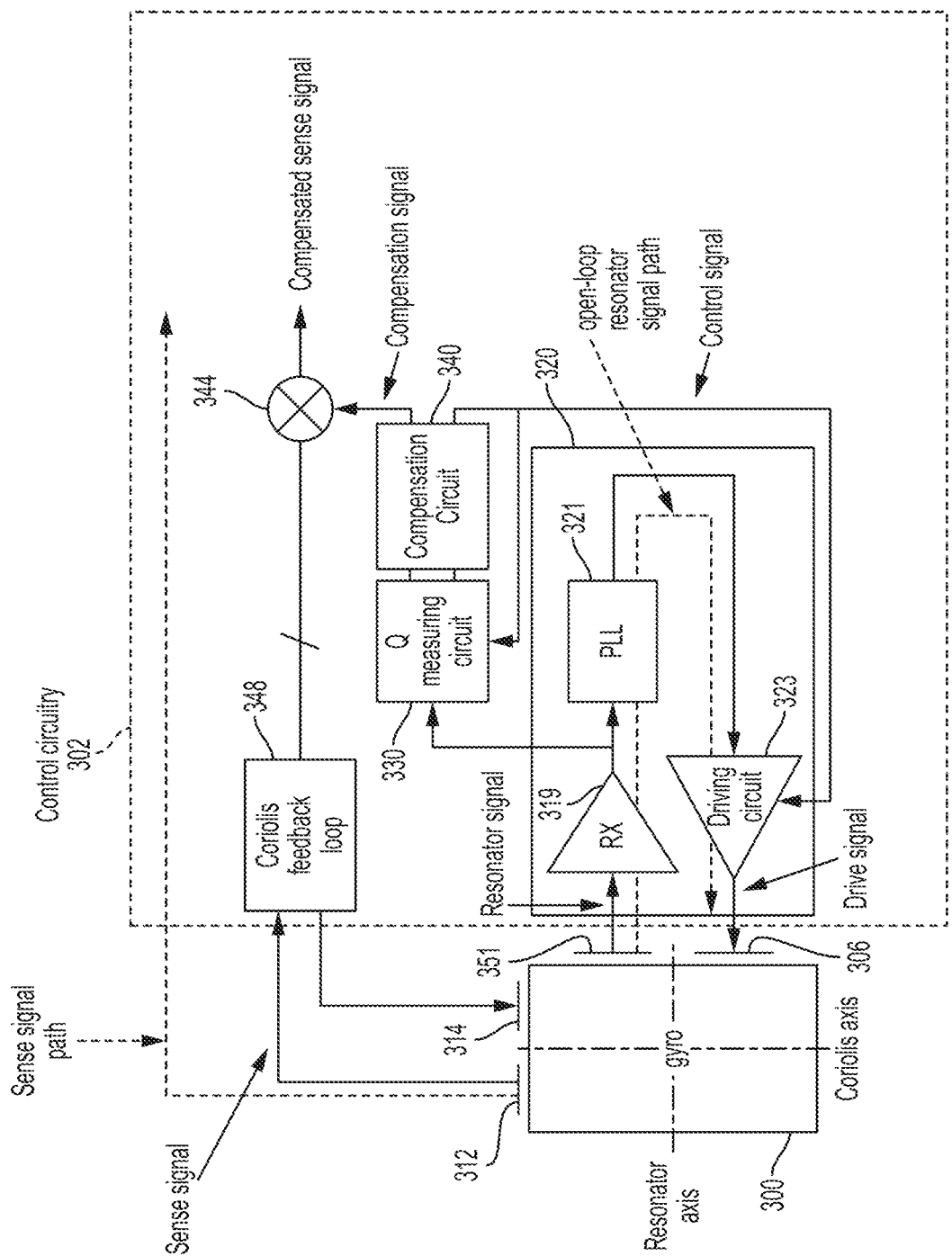
FIG. 3A is a block diagram illustrating control circuitry for compensating a MEMS gyroscope for quality factor variations, in accordance with some embodiments of the technology described herein.

One representative control circuitry is illustrated in FIG. 3A, in accordance with some embodiments. FIG. 3A is a block diagram illustrating a MEMS gyroscope 300, which may serve as MEMS gyroscope 10 (an example of which is illustrated in FIG. 2) and control circuitry 302. MEMS gyroscope 300, referred to herein also as a "gyro" is characterized by a resonator axis (i.e., the axis along which the resonator oscillates) and a Coriolis axis (i.e., the axis along which the sensor moves in response to a Coriolis force). Furthermore, MEMS gyroscope 300 includes drive electrode 306, motion detector electrode 351, sense electrode 312 and feedback electrode 314. Drive electrode 306 may be an electrode of a driver for driving the gyro's resonator, examples of which being a stationary electrode 104 and a finger 105 (see FIG. 2). Motion detector electrode 351 may be an electrode of a motion detector for sensing motion of the gyro's resonator, examples of which being a stationary electrode 110 and a finger 114. Sense electrode 312 may be an electrode of a motion detector for sensing motion of the gyro's sensor, examples of which being a stationary electrode 123 and a finger 133. Feedback electrode 314 may be used to control motion of the gyro's sensor. For example, the feedback electrode may be driven to limit motion of the sensor in the Coriolis axis. Using the feedback to limit motion of the sensor may render the sensor less sensitive to variations in temperature or to environmental stress. The feedback electrode may be implemented using the same electrode as the sense electrode, or using a separate electrode. In the embodiments in which the same physical electrode is shared, this physical electrode may serve as the sense electrode during a first time interval and may serve as the feedback electrode during a second time interval.

Control circuitry 302 includes resonator signal path controller 320, Coriolis feedback loop 348, quality factor (Q) measuring circuit 330, compensation circuit 340 and combiner 344. Resonator signal path controller 320 includes receiver (RX) 319, phased locked loop (PLL) 321 and driving circuit 323. RX 319 receives a resonator signal generated in response to motion of the gyro's resonator, and may include a voltage amplifier, a current amplifier, a trans-impedance amplifier, a filter and/or other suitable circuit components. PLL 321 may be configured to determine the resonant frequency of the gyro's resonator based on the resonator signal received by RX 319. For example, PLL 321 may be configured to lock to the fundamental frequency of the resonator signal. Alternatively, or additionally, PLL 321 may be used to ensure that the gyro's resonator is driven at its resonant frequency. The gyro's resonator may be driven through driving circuit 323, which may include an amplifier, a current generator, a trans-conductance amplifier, and/or other suitable circuit components. The signal path between motion detector electrode 351 and drive electrode 306 is referred to as the "open-loop resonator signal path." This path is defined as an open-loop path because it does not regulate the amplitude of the resonator signal to force it to a constant value, as it would otherwise be the case in a closed-loop arrangement. In the example of FIG. 3A, the open-loop resonator signal path includes RX 319, PLL 321 and driving circuit 323, though more or less components may be included, in other embodiments.

Coriolis feedback loop 348 may include circuitry for controlling the operations of the gyro's sensor. For example Coriolis feedback 348 loop may limit motion of the sensor in the Coriolis axis, thus diminishing the sensor's susceptibility to temperature variations. Coriolis feedback loop 348 may include an amplifier, such as a sense amplifier (SA) and analog and/or digital circuits for driving feedback electrode 314 to limit sensor motion. The output of the Coriolis feedback circuit may be an amplified and/or digitized version of the sense signal or a replica of the sense signal. It should be appreciate that in circumstances in which the gyro's resonator experiences a change in quality factor, such a change may be reflected in the sense signal, thus distorting the angular velocity detection. The path between the sense electrode 312 and the output of control circuitry 302 (i.e., the compensated sense signal) is referred to herein as the "sense signal path."

Quality factor measuring circuit 330 is configured to determine the quality factor of the gyro's resonator from the resonator signal. In one example quality factor measuring circuit 330 receives the resonator signal from RX 319 and determines whether the quality factor has fallen below a threshold or whether the rate at which the quality factor decays is greater than a threshold rate. Once it is determined that the quality factor has dropped below a threshold or has varied at a rate that is greater than a threshold rate, compensation may be performed using compensation circuit 340. It should be appreciated, however, that not all embodiments are limited to the use of threshold values to initiate a compensation. For example, in some embodiments, compensation is performed in a free-run fashion, whereby the compensation is continuously performed even if variations in the quality factor are minimal.

Compensation of the gyroscope may be performed in numerous ways using compensation circuit 340. In some embodiments, the compensation may be performed by varying a characteristic of the drive signal based on the determined quality factor (referred to as the "open-loop resonator path compensation"). As such, the compensation circuit 340 may have an output terminal coupled to a control terminal of driving circuit 323. The signal used for controlling the driving circuit 323 is referred to as the control signal. Additionally, or alternatively, compensation may be performed by combining (e.g., by multiplying or dividing) the sense signal with a compensation signal having one or more time characteristics determined using the quality factor (referred to as the "sense signal path compensation"). As such, compensation circuit 340 may have an output terminal coupled to a combiner 344. The combiner 344 may have a second terminal coupled to the closed-loop sense path.

Figure 3B:
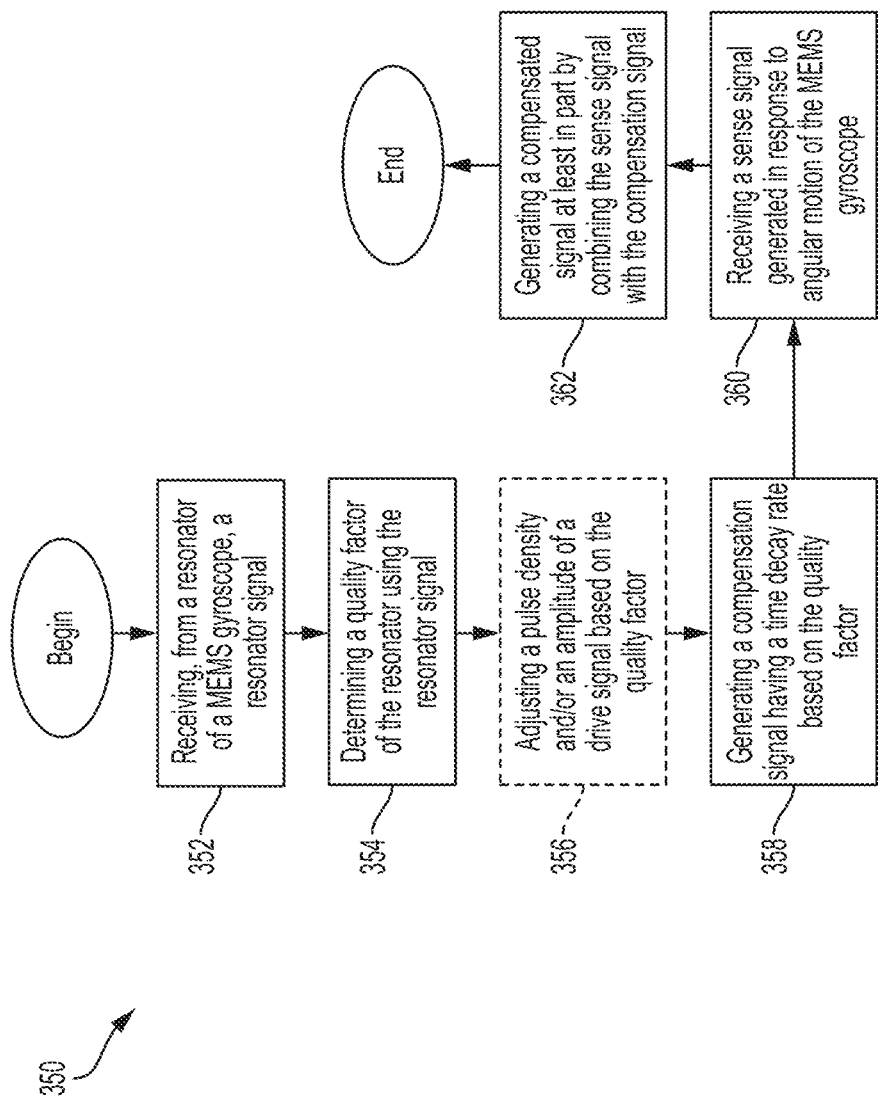
FIG. 3B is a flowchart illustrating a method for compensating a MEMS gyroscope for quality factor variations, in accordance with some embodiments of the technology described herein.

An illustrative method for compensating a gyroscope is depicted in FIG. 3B, in accordance with some embodiments. Compensation method 350 begins at act 352, in which a resonator signal is received from a resonator of a MEMS gyroscope. For example, the resonator signal may be received from the motion detector electrode 351 of FIG. 3A. The resonator signal may be generated in response to motion of the resonator. At act 354, the quality factor of the resonator may be determined using the resonator signal, for example using quality factor measuring circuit 330. The quality factor may be determined in the time domain or in the frequency domain. When determined in the time domain, the quality factor may be inferred from the rate at which the resonator signal (or the envelope of the resonator signal) varies over time. When determined in the frequency domain, the quality factor may be inferred from the bandwidth of the resonator signal in relation to its peak frequency.

Optionally, at act 356, one or more characteristics of the drive signal (the signal with which the resonator is driven)

may be adjusted, using a control signal, based on the quality factor determined at act 354. The characteristic(s) of the drive signal may be such that, when varied through the control signal, lead to a variation in the electrostatic force applied to the resonator. In some embodiments, the characteristic that is varied depending on the quality factor is the average of the drive signal, the pulse density or duty cycle of the drive signal, and/or the amplitude of the drive signal. Accordingly, the inventor has appreciated that increasing the average, pulse density, duty cycle and/or amplitude of the drive signal may lead to an increase in the electrostatic force driving the resonator. The extent to which the electrostatic force is varied by average modulation, pulse density modulation, duty cycle modulation and/or amplitude modulation may be set depending on the variation of quality factor. In some embodiments, compensation circuit 340 may be arranged to increase the average, pulse density, duty cycle and/or the amplitude of the drive signal in response to a decrease in the quality factor.

At act 358, a compensation signal having one or more time characteristic determined using the quality factor obtained at act 354 may be generated. One specific example of a time characteristic is the rate at which the compensation signal decays over time. In this example, the compensation signal may be varied from a high level to a low level, and the rate at which this variation takes place may be controlled based on the quality factor. For example, in some embodiments, the rate of decay may be set to be proportional to the quality factor. In another example, the rate of decay may be set to be equal to the inverse of the bandwidth of the resonator. Examples of compensation signals are illustrated further below.

At act 360, a sense signal generated in response to a Coriolis force caused by angular motion of the gyroscope is received. For example, the sense signal may be received from sense electrode 312. Optionally, stabilization of the motion of the gyroscope's sensor may be performed using Coriolis feedback loop 348.

At act 362, a compensated sense signal may be obtained using the sense signal received at act 360 and the compensation signal generated at act 358. The sense signal and the compensation signal may be combined in any suitable way, including as a multiplication, mixing, or division. The compensated sense signal may be output from the control circuitry 302, and may be indicative of the velocity of the angular motion experienced by the gyroscope.

In some embodiments, compensation of the gyroscope for quality factor variations may be performed, at least partially, by varying the electrostatic force driving the resonator. An increase in the electrostatic force may be achieved by increasing the time average of the drive signal. An increase in the signal average may in turn be achieved by increasing the signal's pulse density, duty cycle and/or amplitude.

FIGS. 4A-4F are plots illustrating how variations in a characteristic of the drive signal can affect the resonator signal, in accordance with some embodiments. In particular, FIG. 4A illustrates the resulting resonator signal when the drive signal of FIG. 4D is applied, FIG. 4B illustrates the resulting resonator signal when the drive signal of FIG. 4E is applied and FIG. 4C illustrates the resulting resonator signal when the drive signal of FIG. 4F is applied. The plots of FIGS. 4A, 4B and 4C are shown in terms of the voltage V of the resonator signal vs. time. The plots of FIGS. 4D, 4E and 4F are shown in terms of the amplitude of the drive signal (for example the voltage of the drive signal) vs. time.

In this example, the pulse density is increased from the drive signal of FIG. 4D to that of FIG. 4E, and again to that of FIG. 4F. That is, the number of pulses present in each period of the signal ($1/f_M$ being the periodicity of the signal) is increased from FIG. 4D to FIG. 4F. As a result, the amplitude of the resonator is increased from FIG. 4A to FIG. 4B and again to FIG. 4C. As illustrated, the envelop of the resonator signal is between $V_1$ and $V_2$ in FIG. 4A, between $V_3$ and $V_4$ in FIG. 4B and between $V_5$ and $V_6$ in FIG. 4C (where $V_5 > V_3 > V_1$ and $V_6 > V_4 > V_2$). The pulse density of the drive signal (or more generally the average of the drive signal) may be increased as shown in FIGS. 4D-4F in response to a decrease in the quality factor as determined by quality factor measuring circuit 330.

Representative operations of the control circuitry 302 when compensation is performed by adjusting the electrostatic force driving the resonator (but without adjusting the compensation signal based on the quality factor) are shown in FIG. 6A. FIG. 6A includes the following six plots: 1) the resonator's quality factor, 2) the pulse density of the drive signal, 3) the average amplitude of the resonator signal, 4) the output $Q_{meas}$ provided by quality factor measuring circuit 330, 5) the compensation signal, and 6) the compensated sense signal. All such quantities are plotted as a function of time. As illustrated in plot 1, the quality factor of the resonator decays over time, due for example to mechanical losses introduced by thermoelastic damping or squeeze-film damping, or due to a temperature increase. As the quality factor decays, signal $Q_{meas}$ exhibits a downward slope resembling that of plot 1 (the slopes can be the same of proportional to each other) (plot 4). As further illustrated in plot 2, the variation in $Q_{meas}$ may trigger a variation in a characteristic of the drive signal (the pulse density in this example, though other characteristics may be varied such as the average, duty cycle and/or the amplitude). Specifically, the pulse density is increased from "pulse density 1" to "pulse density 2." Since the pulse density is increased, the average amplitude of the resonator signal is also increased (plot 3). It should be appreciated that, because the resonator has a finite quality factor, the average amplitude of the resonator increases according to a non-step function in response to the variation in the pulse density. Plot 3 includes an inset showing how the instantaneous amplitude of the resonator signal varies over time (with a peak-to-peak amplitude equal to $\Delta V$). As a side effect to the variation in the pulse density, $Q_{meas}$ exhibits an unwanted feature 610 (a triangular peak in this example). The compensation signal of plot 5 is constant, since in this embodiment the compensation signal is not utilized. As shown in plot 6, the compensated sense signal exhibits a downward slope due to the decrease in the quality factor. However, unlike the quality factor, the compensated sense signal exhibits an increases 612 resulting from the change in pulse density. It should be appreciated that increase 612 occurs with a delay $t_D$ relative to change in pulse density. Increase 612 compensates for the change in quality factor, at least during a certain time period.

Figure 5A:
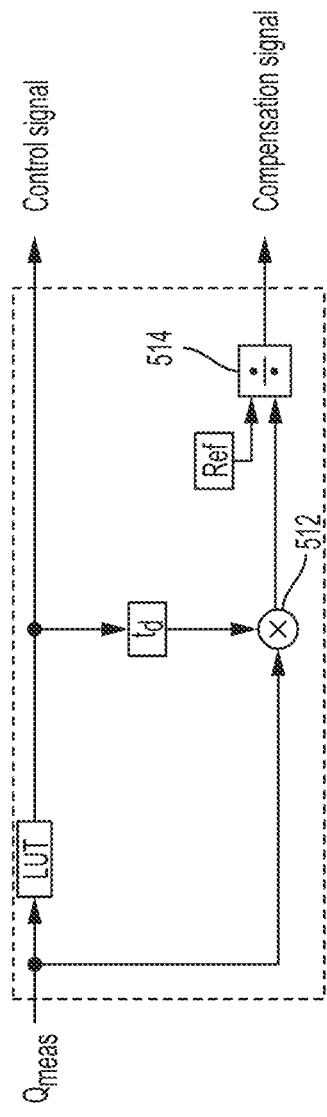
FIG. 5A is a block diagram of an illustrative compensation circuit that may be used in the control circuitry of FIG. 3A, in accordance with some embodiments of the technology described herein.
Figure 5B:
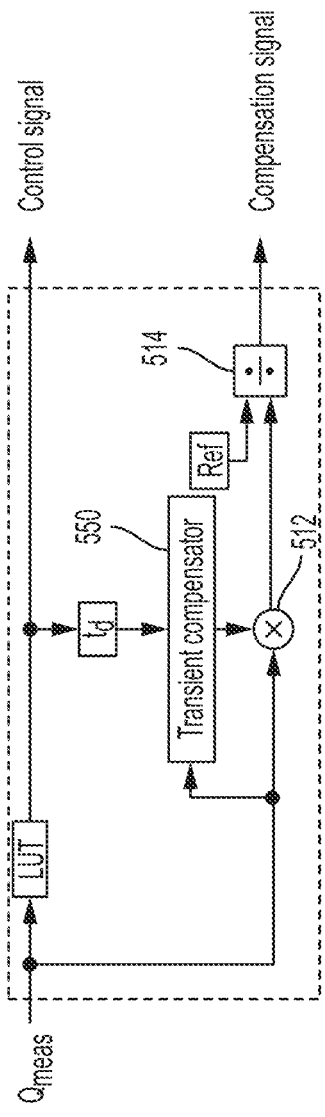
FIG. 5B is a block diagram of another illustrative compensation circuit that may be used in the control circuitry of FIG. 3A including a transient compensation circuit, in accordance with some embodiments of the technology described herein.
Figure 5C:
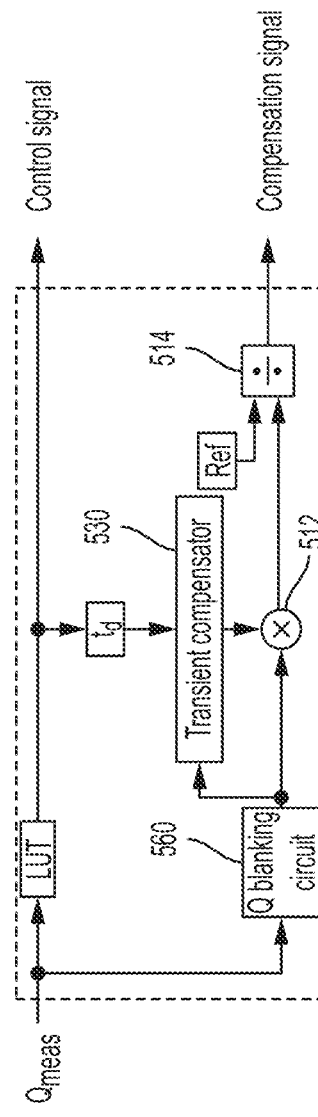
FIG. 5C is a block diagram of yet another illustrative compensation circuit that may be used in the control circuitry of FIG. 3A including a transient compensation circuit and a blanking circuit, in accordance with some embodiments of the technology described herein.

To further improve the compensation, in some embodiments, a compensation signal having a time characteristic determined using the quality factor obtained at act 354 may be used. Generation of the compensation signal may be performed using compensation circuit 340 (FIG. 3A). FIGS. 5A-5C illustrate alternative possible implementations for compensation circuit 340, in accordance with some embodiments. As illustrated, each embodiment receives information indicative of the quality factor, in the form of a signal $Q_{meas}$, from quality factor measuring unit 330. In addition, each embodiment outputs a compensation signal, and optionally, a control signal for controlling driving circuit 323.

The embodiment of FIG. 5A includes a look up table (LUT), which contains therein data representing characteristics (e.g., average, amplitude, duty cycle and pulse density) which may be accorded to the drive signal. The characteristics may be mapped in the LUT as a function of quality factor. That is, each value of the quality factor may correspond to an appropriate value of the characteristic. Mapping of quality factor versus characteristics may be performed as part of a calibration routine, in which it is determined how to appropriately drive the resonator based on different quality factors.

Furthermore, this embodiment includes a delay unit $t_D$, a multiplier 512, a divider 514, and a reference generator "Ref." Delay unit $t_D$ may introduce a delay substantially matching delay $t_D$, which is shown for example in FIG. 6A, plot 6. In some embodiments, divider 514 may be configured to generate the compensation signal such that is it proportional to the ratio Ref/$Q_{meas}$. For example, the compensation signal may be given by: Ref/($Q_{meas}$*pulse_density(t−$t_D$)), where pulse_density is the real-time pulse density of the drive signal.

Operations of the embodiment of FIG. 5A are illustrated in the six plots of FIG. 6B. Unlike FIG. 6A, the compensation signal of FIG. 6B is varied in response to a change in the signal $Q_{meas}$ (FIG. 6B, plot 5). Specifically, in this circumstance, the compensation signal exhibits an upward slope due to the decrease in the quality factor. As further illustrated in plot 5, the compensation signal exhibits an unwanted feature 614 arising in response to feature 610. Furthermore, the compensation signal exhibits a discontinuity 616, responsive to the change in pulse density. As illustrated in plot 6, the compensated sense signal is substantially flat (unlike the compensated sense signal of FIG. 6A, which has a downward slope) thanks to the upward slope in the compensation signal. However, the compensated sense signal further includes a feature 624 (responsive to feature 614) and spike 626 (responsive to discontinuity 616).

The embodiment of FIG. 5B includes a transient compensation circuitry 550, which may be configured to limit or eliminate spike 626 or other abrupt variations in the compensated sense signal arising when the pulse density (or other characteristics) of the drive signal is varied from one value to another. In some embodiments, the components of FIGS. 5A-5C may be implemented as digital circuits. It should be appreciated, however, that analog implementations for at least some of these components are also possible.

Transient compensation circuitry 550 may include circuitry for rendering the discontinuity shown in FIG. 6B, plot 5 more gradual. In some embodiments, transient compensation circuitry 550 may have an impulse response with a time decay rate $\tau$ that depends on the quality factor determined at act 354. In one example, the time decay rate $\tau$ of the transient compensation circuitry 550 is proportional to the quality factor. In another example, the time decay rate $\tau$ is equal to the inverse of the bandwidth $\Delta f$ of the resonator. The transient compensation circuitry 550 may be implemented in any of numerous ways, including a digital filter (e.g., a first-order filter, a second-order filter or any type of higher order filter). When implemented as an analog circuit, the filter may include a lossy element (e.g., a resistive element) whose loss is varied depending on the quality factor to produce different decay rates. Operations of the embodiment of FIG. 5B are illustrated in the six plots of FIG. 6C. Specifically, as shown in plot 5, the discontinuity 616 has been replaced with a slowly decaying variation 618 (e.g., an exponentially decaying response) having a decay time rate $\tau$. Unlike the embodiment of FIGS. 5A and 6B, the compensated sense signal produced in this manner does not exhibit a spike 626. (see FIG. 6C, plot 6), thus reducing the signal distortion.

The embodiment of FIG. 5C includes a quality factor blanking circuit 560, which may be configured to limit or eliminate feature 624 from the compensated sense signal, thereby maintaining the sensitivity of the gyroscope substantially constant. In some embodiments, the Q blanking circuit may be configured to force the compensation signal to a substantially constant value for a predefined period (such as for the duration of feature 610, or for a duration that is between $\tau$ and 20$\tau$, between 5$\tau$ and 20$\tau$, between 10$\tau$ and 20$\tau$, between 15$\tau$ and 20$\tau$, between $\tau$ and 10$\tau$, between 5$\tau$ and 10$\tau$, or within any suitable range within such ranges). The duration of the predefined period may be tied to the quality factor. In some embodiments, Q blanking circuit 560 is implemented using one or more capacitors or digitally using one or more registers. Operations of the embodiment of FIG. 5C are illustrated in FIG. 6D. Specifically, plot 5 illustrates how the compensation signal is maintained to a constant value (unlike the compensation signal of FIG. 6C) throughout the duration of the $Q_{meas}$ peak, thus eliminating feature 614. As a result, the compensated sense signal (FIG. 6D, plot 6) remains substantially constant throughout the period of the $Q_{meas}$ peak, thus eliminating feature 624. As a result, the susceptibility of the compensated signal to quality factor variations is substantially limited without introducing unwanted distortions.

IV. Conclusion

Aspects of the technology described herein may provide one or more benefits, some of which have been previously described. Now described is a non-limiting example of a benefit. It should be appreciated that not all aspects and embodiments necessarily provide the benefit described. Further, it should be appreciated that aspects of the technology described herein may provide additional benefits to that now described. Some aspects of the technology described herein provide for MEMS gyroscopes having a substantially reduced susceptibility to quality factor variations arising in the gyroscope's resonator.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately" and "about" may include the target value.

What is claimed is:

1. A method comprising:
    receiving, from a resonator of a microelectromechanical system (MEMS) gyroscope, a resonator signal generated in response to motion of the resonator;
    determining a quality factor of the resonator using the resonator signal;
    generating a compensation signal having at least one time characteristic determined using the quality factor of the resonator;
    receiving, from a sensor of the MEMS gyroscope, a sense signal generated in response to angular motion of the MEMS gyroscope; and
    generating a compensated sense signal using the sense signal and the compensation signal.

2. The method of claim 1, wherein generating a compensation signal having at least one time characteristic determined using the quality factor of the resonator comprises generating a compensation signal having a time decay rate determined using the quality factor of the resonator.

3. The method of claim 1, further comprising:
   detecting a resonant frequency of the resonator using the resonator signal; and
   driving the resonator with a drive signal determined using the resonant frequency and the quality factor.

4. The method of claim 3, wherein driving the resonator with a drive signal determined using the resonant frequency and the quality factor comprises varying an average of the drive signal based on the quality factor.

5. The method of claim 3, wherein driving the resonator with a drive signal determined using the resonant frequency and the quality factor comprises varying a pulse density of the drive signal based on the quality factor.

6. The method of claim 1, wherein generating a compensated sense signal using the sense signal and the compensation signal comprises generating a compensated sense signal by multiplying the sense signal with the compensation signal.

7. The method of claim 1, further comprising maintaining the compensation signal substantially constant during a predefined time period.

8. The method of claim 7, further comprising setting a duration of the predefined time period based on the quality factor.

9. A microelectromechanical systems (MEMS) apparatus comprising:
   a gyroscope comprising a sensor and a resonator; and
   control circuitry configured to:
     receive, from the resonator, a resonator signal generated in response to motion of the resonator;
     determine a quality factor of the resonator using the resonator signal;
     generate a compensation signal having a time characteristic determined using the quality factor of the resonator;
     receive, from the sensor, a sense signal generated in response to angular motion of the MEMS gyroscope; and
     generate a compensated sense signal using the sense signal and the compensation signal.

10. The MEMS apparatus of claim 9, wherein the control circuitry is configured to generate a compensation signal having a time characteristic determined using the quality factor of the resonator at least in part by generating a compensation signal having a time decay rate determined using the quality factor of the resonator.

11. The MEMS apparatus of claim 9, wherein the control circuitry is further configured to:
    detect a resonant frequency of the resonator based on the resonator signal; and
    drive the resonator with a drive signal determined using the resonant frequency and the quality factor.

12. The MEMS apparatus of claim 11, wherein the control circuitry is configured to drive the resonator with a drive signal determined using the resonant frequency and the quality factor at least in part by varying an average of the drive signal based on the quality factor.

13. The MEMS apparatus of claim 11, wherein the control circuitry is configured to drive the resonator with a drive signal determined using the resonant frequency and the quality factor at least in part by varying a pulse density of the drive signal based on the quality factor.

14. The MEMS apparatus of claim 9, wherein the control circuitry is configured to generate a compensated sense signal using the sense signal and the compensation signal at least in part by generating a compensated sense signal by multiplying the sense signal with the compensation signal.

15. The MEMS apparatus of claim 9, wherein the control circuitry is further configured to maintain the compensation signal substantially constant during a predefined time period.

16. A microelectromechanical systems (MEMS) apparatus comprising:
    a gyroscope comprising a sensor and a resonator;
    a quality factor measuring circuit coupled to a motion detection electrode of the resonator;
    a compensation circuit having an input terminal coupled to the quality factor measuring circuit and an output terminal, the compensation circuit comprising transient compensation circuitry; and
    signal combination circuitry coupled to the sensor and the output terminal of the transient compensation circuitry.

17. The MEMS apparatus of claim 16, wherein the transient compensation circuitry comprises a filter.

18. The MEMS apparatus of claim 16, further comprising a pulse density modulator coupled to the transient compensation circuitry and the resonator.

19. The MEMS apparatus of claim 16, wherein the compensation circuit comprises a quality factor blanking circuit.

20. The MEMS apparatus of claim 16, wherein the sensor comprises a first mass and the resonator comprises a second mass elastically coupled to the first mass.

* * * * *